(12) United States Patent
Motozawa (10) Patent No.: US 12,375,072 B2
(45) Date of Patent: Jul. 29, 2025

(54) JITTER CANCELLATION CIRCUIT

(71) Applicant: RENESAS ELECTRONICS CORPORATION, Tokyo (JP)

(72) Inventor: Atsushi Motozawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 18/364,225

(22) Filed: Aug. 2, 2023

(65) Prior Publication Data
US 2024/0072779 A1   Feb. 29, 2024

(30) Foreign Application Priority Data

Aug. 29, 2022   (JP) .................................. 2022-136199

(51) Int. Cl.
*H03K 5/02*   (2006.01)
*H03K 5/133*   (2014.01)
*H03K 5/135*   (2006.01)

(52) U.S. Cl.
CPC ............... *H03K 5/02* (2013.01); *H03K 5/133* (2013.01); *H03K 5/135* (2013.01)

(58) Field of Classification Search
None
See application file for complete search history.

(56) References Cited

U.S. PATENT DOCUMENTS 11,804,841 B2 * 10/2023 Choi ................. H03K 19/00384
2010/0309733 A1 * 12/2010 Abe ....................... G11C 29/028
365/189.12

OTHER PUBLICATIONS

Y Niki et al., "A supply-noise-rejection technique in ADPLL with noise-cancelling current source", 2013 Proceedings ESSCIRC, Oct. 2013.

* cited by examiner

*Primary Examiner* — Cassandra F Cox
(74) *Attorney, Agent, or Firm* — Rimon P.C.

(57) ABSTRACT

A jitter cancellation circuit includes a clock buffer and a current control unit. The clock buffer inputs a clock outputted from a clock propagation element driven by a power supply voltage. Further, the clock buffer decreases with respect to a power supply voltage according to an increase in an operating current, while giving a delay time increased according to a decrease in the operating current to output the clock. The current control unit is configured to increase/decrease the operating current of the clock buffer in an opposite phase of a fluctuation component of the power supply voltage.

14 Claims, 11 Drawing Sheets

JITTER CANCELLATION CIRCUIT

CROSS-REFERENCE TO RELATED APPLICATIONS

The present application claims priority from Japanese Patent Application No. 2022-136199 filed on Aug. 29, 2022, the content of which is hereby incorporated by reference to this application.

BACKGROUND

The present disclosure relates to a technique for sustaining clock jitter.

It is known that minute fluctuations in a clock cycle, which are called jitter, occur in a fixed-frequency clock. If the jitter is large, any shifts may occur in operation timing of a circuit group that operates by receiving supply of the clock. Therefore, a technique for suppressing the clock jitter is required.

For example, Non-Patent Document 1 ("A supply-noise-rejection technique in ADPLL with noise-cancelling current source", Y Niki et al., 2013 Proceedings ESSCIRC, October 2013) discloses a configuration of sustaining jitter generated by an influence of a noise component (AC component) of a power supply voltage (DC) in a clock generation oscillator arranged inside an ADPLL (All-Digital Phase-Locked Loop).

Specifically, a current ($I_{OSC}$) supplied from a power supply line to the oscillator is copied by a current mirror, and an AC component extracted from the copied current is caused to flow from the above current ($I_{OSC}$). Thus, a circuit configuration for suppressing variations in delay time that occurs in the oscillator is shown.

SUMMARY

In an actual circuit, a clock generated by a PLL or the like is transmitted to a clock supply destination circuit by using a clock propagation element such as CTS (Clock Tree Synthesis) or a repeater. However, even in these clock propagation elements, jitter may be superimposed on the passing clock due to the influence of the noise component of the power supply voltage.

Therefore, even if the jitter of the clock outputted from the PLL or the like is sufficiently suppressed by Non-Patent Document 1 or the like, it may be difficult to reduce the jitter of the clock actually inputted to the supply destination circuit.

The present disclosure is for solving the above-described problems, and provides a jitter cancellation circuit capable of reducing the clock jitter at the clock supply destination circuit by compensating for jitter generated due to power supply noise with respect to the clock outputted from the PLL or the like.

Other problems and novel features will become apparent from the description of the present specification and the accompanying drawings.

A jitter cancellation circuit according to one embodiment includes: a clock buffer and a current control unit. The clock buffer inputs a clock outputted from a clock generation circuit or a clock propagation element that is driven by a power supply voltage. Further, the clock buffer decreases with respect to the inputted clock according to an increase in the operating current, while giving a delay time increased according to a decrease in the operating current and outputting the clock. The current control unit is configured to increase and decrease an operating current of the clock buffer in an opposite phase of a fluctuation component of the power supply voltage, According to the above embodiment, it is possible to reduce the clock jitter in the clock supply destination circuit by compensating for the jitter generated due to the power supply noise.

DETAILED DESCRIPTION

Hereinafter, each embodiment will be detailed with reference to the drawing. Incidentally, the same reference numerals are denoted to the same or corresponding part, and a description thereof will be not repeated.

First Embodiment (Clock Jitter Due to Power Supply Noise)

Before describing the present embodiment, clock jitter due to power supply noise will be described.

Figure 1:
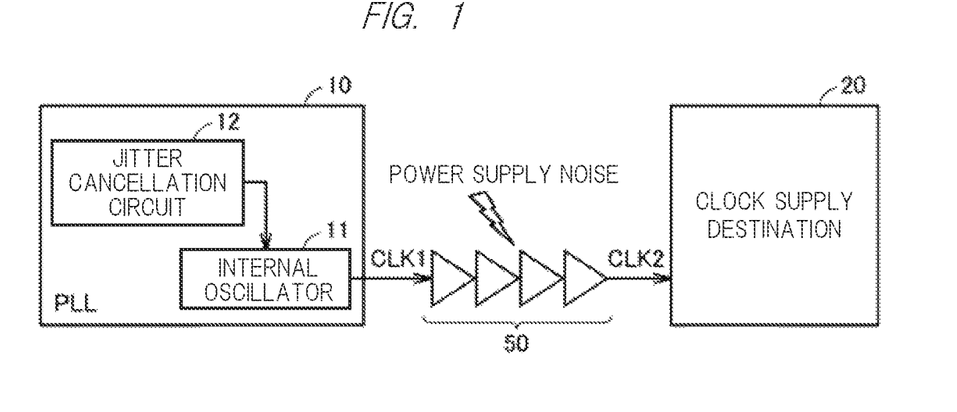
FIG. 1 is a conceptual diagram for explaining a general clock supply form.

FIG. 1 shows a conceptual diagram for explaining a general clock supply form.

Referring to FIG. 1, a clock generation circuit 10 is typically configured by a PLL (Phase-Locked Loop), and generates a constant frequency clock CLK1. Incidentally, as will be apparent from the following description, a jitter cancellation circuit according to the present embodiment can be applied to suppress jitter of a clock generated by a clock generation circuit 10 of any configuration.

For example, the clock generation circuit 10 is configured so as to include an internal oscillator 11 that generates a clock CLK1 and a jitter suppression circuit 12 that suppresses jitter of the clock CLK1. As described above, in Non-Patent Document 1, provided as the jitter suppression circuit 12 is a configuration for suppressing an AC component of a current supplied to the internal oscillator 11. Consequently, the jitter of the clock CLK1 outputted from the clock generation circuit 10 is suppressed.

A clock propagation element 50 driven by a power supply voltage is arranged in a propagation path of the clock CLK1 from the clock generation circuit 10 to a clock supply destination circuit 20. The clock propagation element 50 means a circuit element that is driven by a power supply voltage and inputs/outputs a clock, the circuit element including a repeater, a buffer (clock buffer) included in a CTS (Clock Tree Synthesis), and an inverter. Therefore, in addition to the inverter, logic circuits such as NAND (Negative Logical Product) gates are also included in the clock propagation elements 50 as long as they include clocks in their inputs and outputs.

A power supply voltage of the clock propagation element 50 is ideally a DC voltage with a constant level, but in reality, AC noise components are superimposed on it. Consequently, the jitter occurs in the clock due to the power supply noise, whose power supply rises and falls, as described in FIG. 2.

Figure 2:
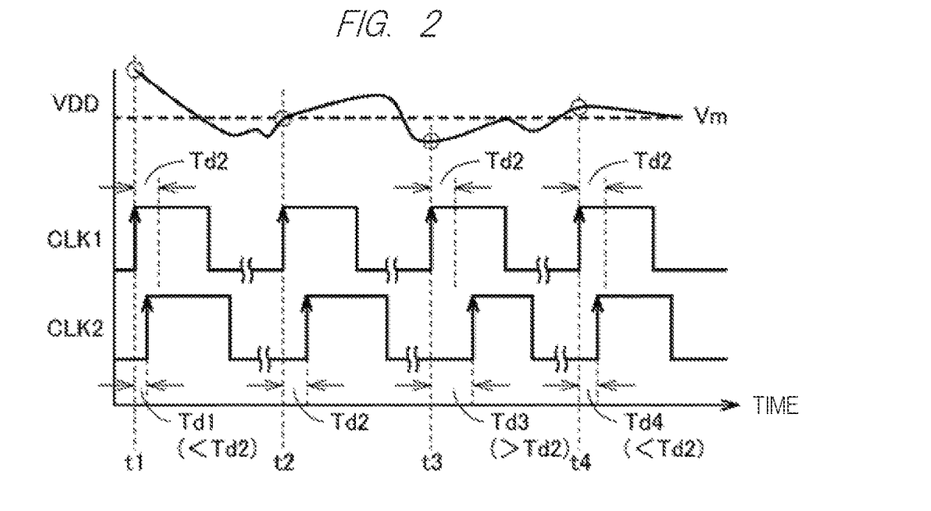
FIG. 2 is a conceptual waveform diagram for explaining jitter caused by power supply noise.

As shown in FIG. 2, a power supply voltage VDD of the clock propagation element 50 has fluctuation components (power supply noise) with respect to an average value Vm. In the clock propagation element 50, delay time occurring between the input and the output varies depending on the power supply voltage VDD. This is because an operating current when the clock propagation element 50 drives an output signal increases or decreases according to a level of the power supply voltage VDD.

FIG. 2 shows an example in which a rising edge of the clock CLK1 is inputted to the clock propagation element 50 at each of times t1 to t4. At this time, the clock propagation element 50 gives delay times Td1 to Td4 corresponding to the power supply voltage VDD. When the power supply voltage VDD is high, the operating current of the clock propagation element 50 is large, so that the delay time is shortened. Conversely, when the power supply voltage VDD is low, the operating current of the clock propagation element 50 is small, so that the delay time is lengthened.

In an example of FIG. 2, at time t2 when the power supply voltage VDD is Vm (average value), the clock propagation element 50 gives delay time Td2 between the rising edges of clocks CLK1 and CLK2. Meanwhile, at times t1 and t4 when the power supply voltage VDD is higher than Vm, delay times Td1 and Td4 occurring in the clock propagation element 50 are shorter than the delay time Td2 at time t2.

In contrast, at time t3 when the power supply voltage VDD is lower than Vm, the delay time Td3 occurring in the clock propagation element 50 is longer than the delay time Td2 at time t2.

Figure 3:
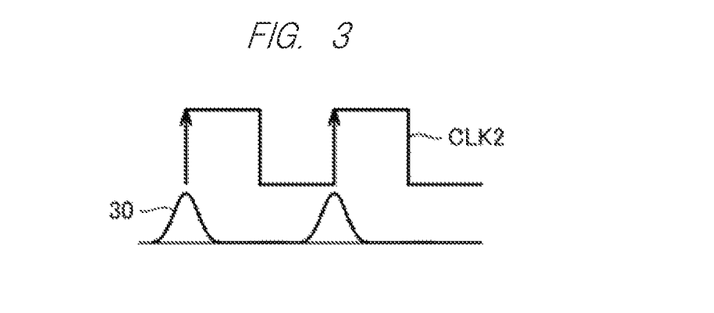
FIG. 3 is a conceptual diagram for explaining a distribution of jitter.

As a result, as shown in FIG. 3, even if the clock CLK1 with a constant cycle is inputted to the clock propagation element 50, at time when the edge of the clock CLK2 rises a distribution as shown in a histogram 30 occurs according to a level of the power supply voltage VDD at a point of the time. As a result, as shown in FIG. 1, even if the clock CLK1 has a constant cycle and is clean, jitter occurs in the clock CLK2 outputted from the clock propagation element 50 and supplied to the supply destination circuit 20.

In the present embodiment, described will be a technique for canceling jitter superimposed on the clock outputted from the clock generation circuit (PLL) 10 at the propagation path to a supply destination of the clock.

Jitter Cancellation Circuit According to First Embodiment

Figure 4:
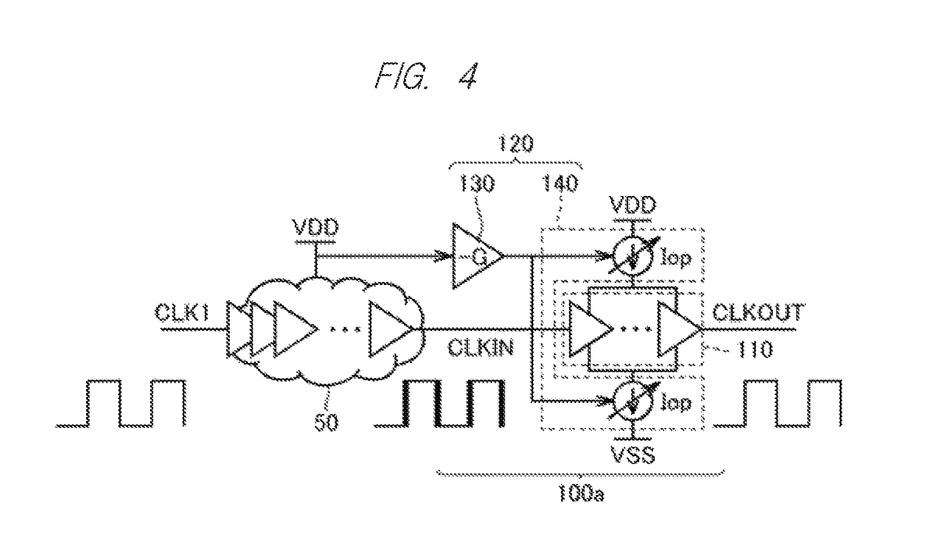
FIG. 4 is a block diagram for explaining a configuration of a jitter cancellation circuit according to a first embodiment.

FIG. 4 is a block diagram for explaining a configuration of a jitter cancellation circuit according to a first embodiment.

As shown in FIG. 4, a jitter cancellation circuit 100a according to a first embodiment includes a clock buffer 110 and a current control unit 120. A clock CLKIN outputted from the clock propagation element 50 is inputted to the clock buffer 110. Hereinafter, the clock CLKIN is also referred to as an input clock CLKIN.

The clock propagation element 50 receives the clock CLK1 and outputs an input clock CLKIN corresponds to a clock CLK2 in FIG. 1. If the fluctuation component (power supply noise) exists in the power supply voltage VDD, the jitter caused by the power supply noise is superimposed on the input clock CLKIN even if the clock CLK1 is clean.

The current control unit 120 increases or decreases an operating current Iop of the clock buffer 110 in an opposite phase of the fluctuation component of the power supply voltage VDD. For example, the current controller unit 120 includes an amplifier 130 that inverts and amplifies the fluctuation component of the power supply voltage VDD, and a variable current source circuit 140 that supplies the operating current Iop to the clock buffer 11. An output current of the variable current source circuit 140 is increased or decreased according to an output of the amplifier 130.

Figure 5:
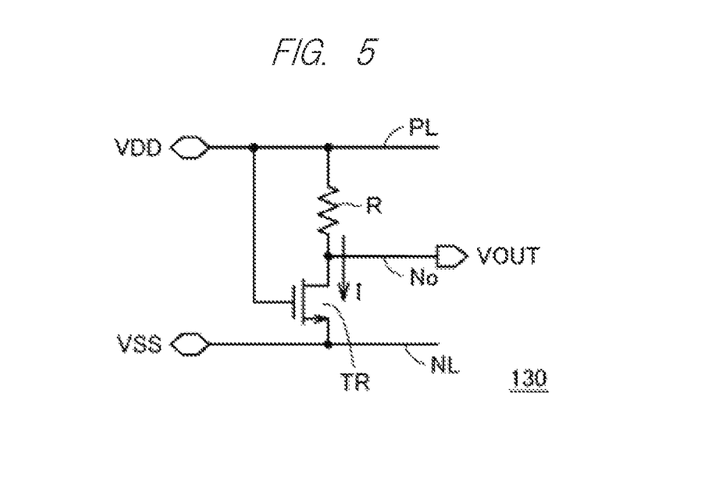
FIG. 5 is a circuit diagram for explaining a basic configuration of an amplifier unit shown in FIG. 4.

FIG. 5 shows a basic configuration diagram of the amplifier 130.

As shown in FIG. 5, the amplifier 130 can be configured by, for example, an inverting amplifier using a transistor TR whose negative electrode is grounded. An example in which the transistor TR is configured by a field effect transistor such as a MOSFET (Metal Oxide Semiconductor Field Effect Transistor) will be described below. A source (negative electrode) of the transistor TR is connected to a ground wiring NL, and the power supply voltage VDD is inputted to a gate (control electrode). Furthermore, a resistance element R is connected between a drain (positive electrode) of the transistor TR and a power supply line PL. An electrical resistance value of the resistance element R is also denoted as R below.

Incidentally, the transistor TR can also be configured by a bipolar transistor having an emitter that is a negative electrode, a collector that is a positive electrode, and a base that is a control electrode.

Figure 6:
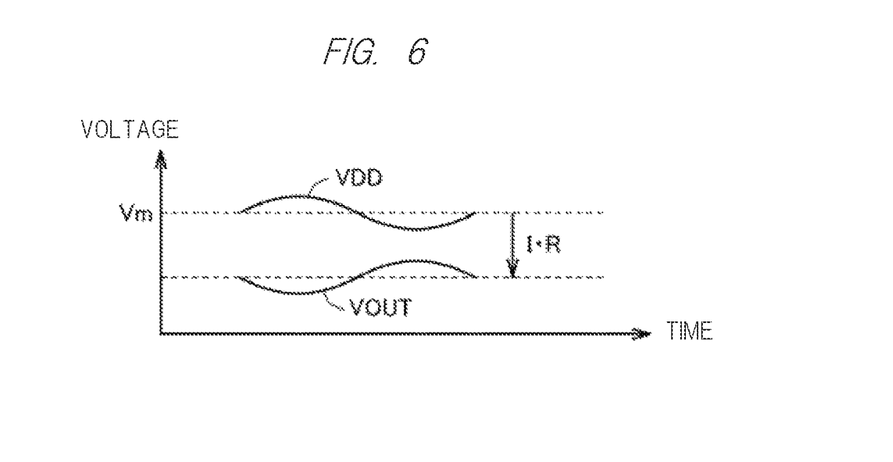
FIG. 6 is a conceptual diagram for explaining input/output characteristics of the amplifier unit shown in FIG. 5.

In FIG. 5, a voltage signal VOUT shown in FIG. 6 is outputted to an output node No corresponding to a connection point between the drain (positive electrode) of the transistor TR and the resistance element R. A current I flowing through the transistor TR changes according to an increase or decrease in the power supply voltage VDD.

As is well known, a gain G, which is a ratio of a variation $\Delta$VOUT of the voltage signal VOUT to a variation $\Delta$VDD of the power supply voltage VDD, due to the amplifier 130 shown in FIG. 5, is given by Equation (1) mentioned blow.

$$G=\Delta VOUT/\Delta VDD=ro\cdot(1-gm\cdot R)/(ro+R) \quad (1)$$

In Equation (1), ro is output resistance of the amplifier 130, and gm is transconductance of the transistor TR. From Equation (1), in order to obtain an anti-phase signal by inversion amplification with G<0, the electrical resistance value R (resistive element R) should be determined so as to comply with 1−rm·R<0, that is, rm·R>1. Alternatively, it is understood that when G<0, an absolute value |G| of the gain increases as the electrical resistance value R increases.

As a result, as shown in FIG. 6, the voltage signal VOUT obtained by inverting and amplifying the variation ΔVDD of the power supply voltage VDD can be outputted from the amplifier 130. Specifically, for the power supply voltage VDD in which the variation ΔVDD is superimposed on the average value Vm (dotted line), the voltage signal VOUT in which the variation ΔVOUT obtained by inverting and amplifying ΔVDD is superimposed on the average value (dotted line) can be obtained. A difference in average value (DC component) between the power supply voltage VDD and the voltage signal VOUT corresponds to I·R.

Figure 7:
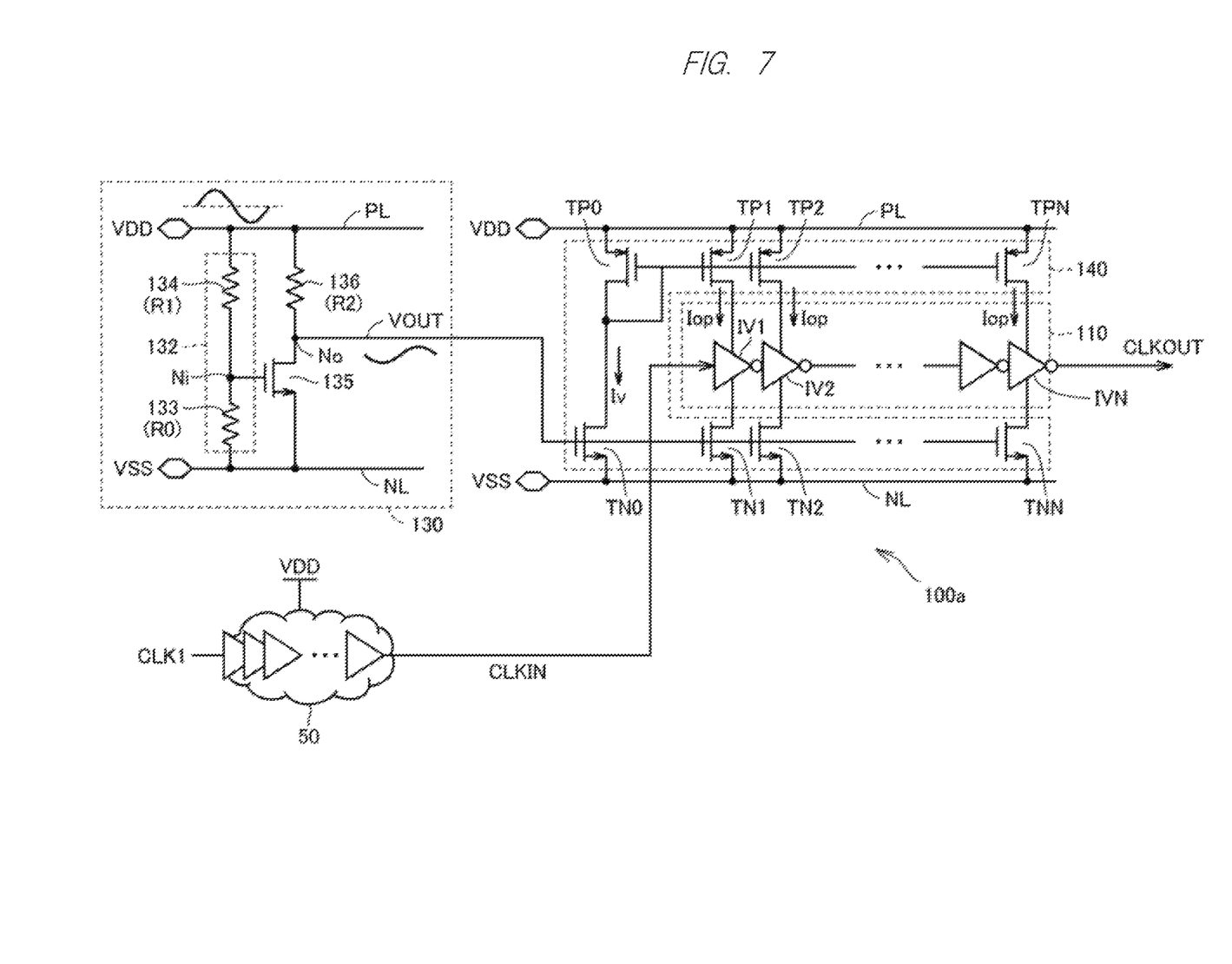
FIG. 7 is a circuit diagram for explaining a configuration example of the jitter cancellation circuit according to the first embodiment.

FIG. 7 shows a circuit diagram for explaining a configuration example of the jitter cancellation circuit according to the first embodiment.

Referring to FIG. 7, the clock buffer 110 has N (N: an integer equal to or greater than 2) inverters IV1 to IVN connected in series. An input clock CLKIN from a clock propagation element 50 is inputted to a first-stage inverter IV1, and a final-stage inverter IVN generates an output clock CLKOUT of a jitter cancellation circuit 100a. The number of stages N of inverters IV1 to IVN is usually an even number, but N may be an odd number for the purpose of obtaining a reversed-phase clock.

The variable current source circuit 140 has P-type transistors TP0 to TPN and N-type transistors TN0 to TNN. An P-type transistor TP0 and an N-type transistor TN0 are connected in series between a power supply line PL (VDD) and a ground line NL (VSS). The P-type transistor TP0 is diode-connected. A voltage signal VOUT outputted from the amplifier 130 is inputted to a gate of the N-type transistor TN0.

The P-type transistors TP1 to TPN are connected between the power line PL and the inverters IV1 to IVN, respectively. Similarly, the N-type transistors TN1 to TNN are connected between the ground line NL and the inverters IV1 to IVN, respectively. The gates of the P-type transistors TP1 to TPN are connected to the gate of the P-type transistor TP0. The gates of the N-type transistors TN1 to TNN are connected to the gate of the N-type transistor TN0. Pairs of N P-type transistors (TP1 to TPN) and N-type transistors (TN1 to TNN) supply the operating currents Iop of the inverters IV1 to IVN, respectively.

In the variable current source circuit 140, a current Iv flowing through the P-type transistor TP0 and the N-type transistor TN0 connected in series changes according to the voltage signal VOUT from the amplifier 130. Specifically, when a potential of the voltage signal VOUT rises, the current Iv increases and, conversely, when the potential of the voltage signal VOUT falls, the current Iv decreases.

The P-type transistors TP1 to TPN form a current mirror with the P-type transistor TP0, and the N-type transistors TN1 to TNN form a current mirror with the N-type transistor TN0. Therefore, the operating current Iop of the inverters IV1 to IVN is proportional to the current Iv that varies according to the voltage signal VOUT. Typically, the operating current Iop and the current Iv are 1:1.

In an example of FIG. 7, the amplifier 130 is configured to further include a voltage dividing circuit 132 in addition to the basic configuration described in FIG. 5. Specifically, the amplifier 130 is configured so as to include resistance elements 133, 134, and 136 and a transistor 135.

The resistance elements 133 (electrical resistance value R0) and 134 (electrical resistance value R1) are connected in series between a power wiring PL (VDD) and a ground wiring NL (VSS) to form a voltage dividing circuit 132. The transistor 135 corresponds to the transistor TR in FIG. 5, and the resistance element 136 (electrical resistance value R2) corresponds to the resistance element R in FIG. 5.

The voltage dividing circuit 132 inputs, to the gate (control electrode) of the transistor 135, a divided voltage of the power supply voltage VDD according to a voltage dividing ratio R0/(R0+R1). Therefore, the higher the electrical resistance value R1, the smaller the voltage dividing ratio and the lower the input voltage to the gate of the transistor 135.

In the configuration of FIG. 7, amplification characteristics of the amplifier 130, specifically, characteristics of the fluctuation component ΔVOUT of the voltage signal VOUT with respect to the fluctuation component ΔVDD of the power supply voltage VDD are obtained by replacing the electrical resistance value R with R2 in Equation (1). That is, the electrical resistance value R2 of the resistance element 136 is determined so that the gain complies with G<0 in Equation (1).

The voltage dividing circuit 132 allows a DC operating point of the amplifier 130 to be adjusted. As shown in FIG. 6, if the electrical resistance value R2 of the resistance element 136 is increased in order to increase the inversion amplification gain in the amplifier 130, a voltage drop of the voltage signal VOUT with respect to the power supply voltage VDD (I·R in FIG. 6) increases and the level of the voltage signal VOUT falls. Therefore, by adjusting the voltage dividing ratio of the voltage dividing circuit 132 in conjunction with a change in the electrical resistance value R2, the DC operating point of the amplifier 130 can be kept constant even if the gain is changed.

Also in the configuration example of FIG. 7, the voltage signal VOUT has the fluctuation component ΔVOUT according to Equation (1), and is generated so as to invert and amplify the fluctuation component ΔVDD (power supply noise) of the power supply voltage VDD. Therefore, the operating current Iop supplied to each of the inverters IV1 to IVN by the variable current source circuit 140 decreases as the power supply voltage VDD rises, while it increases as the power supply voltage VDD falls. That is, the operating current Iop is controlled so as to increase and decrease in an opposite phase to the fluctuation component of the power supply voltage VDD.

Figure 8:
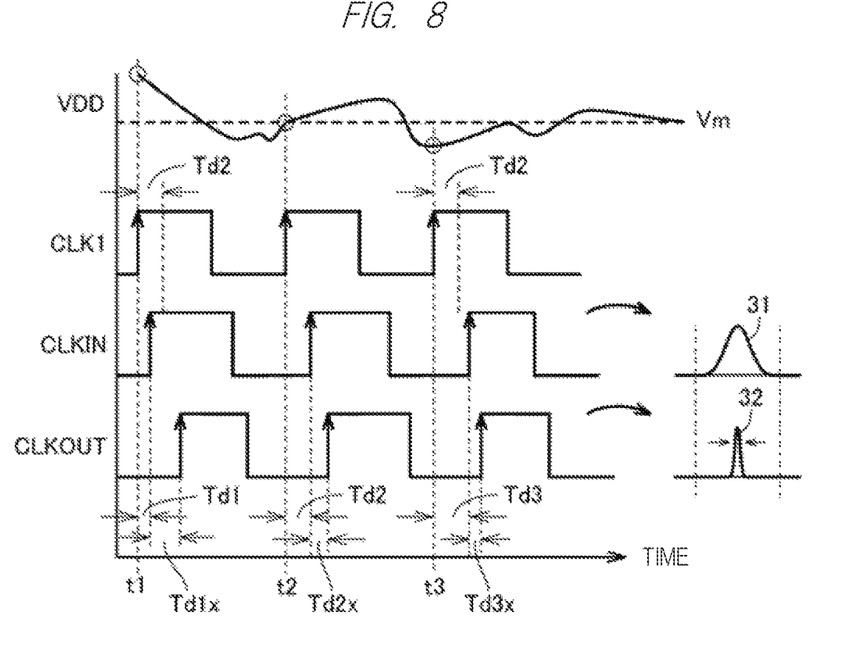
FIG. 8 is a conceptual waveform diagram for explaining an operation of the jitter cancellation circuit shown in FIG. 7.

Consequently, the jitter cancellation circuit can suppress the jitter of the output clock CLKOUT by operating as shown in FIG. 8.

FIG. 8 shows delay times given by the clock propagation element 50 and the jitter cancellation circuit 100a under the same power supply voltage VDD waveform as that in FIG. 2.

The clock CLK1 is shown as a clean waveform as in FIG. 2, and the input clock CLKIN corresponds to a clock CLK2 in FIG. 2. That is, the delay times Td1 to Td3 given by the clock propagation element 50 to the rising edges of the clock CLK1 at times t1 to t3 are the same as that in FIG. 2. Specifically, the delay time Td1 at time t1 when VDD>Vm is shorter than the delay time Td2 at time t2 when the power supply voltage VDD is the average value Vm. Then, the delay time Td3 at time t3 when VDD<Vm is longer than Td2. As a result, the jitter as indicated by a clock cycle histogram 31 is generated to the input clock CLKIN.

In contrast, in the jitter cancellation circuit 100a, the operating current Iop of the clock buffer 110 at the time t1 when VDD>Vm is controlled so as to be smaller than that at the time t2 when VDD=Vm by the amplifier 130 and the variable current source circuit 140 which constitute the current control unit 120. As a result, in the clock buffer 110, delay time Td1x added between the input clock CLKIN and the output clock CLKOUT becomes longer than delay time Td2x of the clock buffer 110 at time t2.

Conversely, the operating current Iop of the clock buffer 110 at time t3 when VDD<Vm is controlled to be greater than that at time t2 when VDD=Vm. As a result, delay time Td3x of the clock buffer 110 at time t3 is shorter than the delay time Td2x of the clock buffer 110 at time t2.

The sum of the delay time by the clock propagation element 50 and the delay time by the jitter cancellation circuit 100a acts on each rising edge of the output clock CLKOUT of the jitter cancellation circuit 100a with respect to the clock CLK1. As a result, the delay times occurring between the clock CLK1 and the output clock CLKOUT at times t1 to t3 shown in FIG. 8 are T1=Td1+Td1x, T2=Td2+Td2x, and T3=Td3+Td3x. it is understood that a difference among these delay times T1 to T3 is less than a difference among the delay times Td1 to Td3 caused by the clock propagation element 50 from a magnitude relation of the delay times Td1 to Td3 and a magnitude relation of the delay times Td1x to Tdx3.

As a result, the jitter of the output clock CLKOUT indicated by the histogram 32 can be made smaller than the jitter of the input clock CLKIN indicated by the histogram 31.

As described above, according to the jitter cancellation circuit 100a according to the first embodiment, it is possible to control an increase or decrease in the operating current Iop of the clock buffer 110 in the opposite phase of the fluctuation component of the power supply voltage VDD that drives the clock propagation element 50. Consequently, the input clock CLKIN outputted from the clock propagation element 50 can be given a delay time corresponding to an increase or decrease in the power supply voltage VDD with characteristics opposite to those of the clock propagation element 50. As a result, it is possible to compensate for the jitter caused by the power supply noise and reduce the clock jitter in the clock supply destination circuit.

Incidentally, in the configuration example of FIG. 7 according to the first embodiment, the resistance element 134 corresponds to an example of a "first resistance element", and the electrical resistance value R1 corresponds to a "first electrical resistance value". Similarly, the resistance element 136 corresponds to an example of a "second resistance element", and the electrical resistance value R2 corresponds to a "second electrical resistance value".

Modification Example of First Embodiment

As described above, the jitter compensation characteristics in the jitter cancellation circuit depend on the input/output characteristics (amplification characteristics) of the voltage signal VOUT with respect to the power supply voltage VDD in the amplifier 130. Therefore, in a modification example of the first embodiment, a configuration example for making it possible to easily adjust the amplification characteristics of the amplifier 130 will be described.

Figure 9:
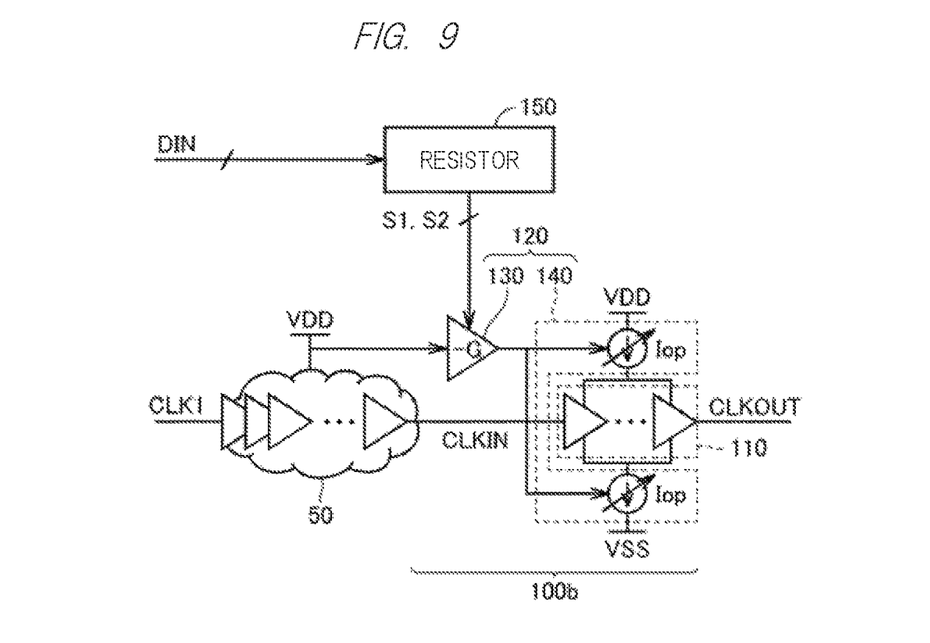
FIG. 9 is a block diagram for explaining a configuration of a jitter cancellation circuit according to a modification example of the first embodiment.

FIG. 9 is a block diagram for explaining the configuration of a jitter cancellation circuit according to a modification of the first embodiment.

Referring to FIG. 9, a jitter cancellation circuit 100b according to a modification example of the first embodiment differs from the jitter cancellation circuit 100a (FIG. 4) according to the first embodiment in that it further includes a register 150. The register 150 receives an input signal DIN for adjusting the amplification characteristics of the amplifier 130. The register 150 is arranged so that the input signal DIN can also be inputted from an outside of the jitter cancellation circuit 100b.

The input signal DIN is stored in the register 150 and is inputted to the amplifier 130 as control signals S1 and S2 of the amplifier 130. For example, some bits of the multi-bit input signal DIN are outputted from the register 150 as the control signals S1 and S2, and is inputted to the amplifier 130.

Figure 10:
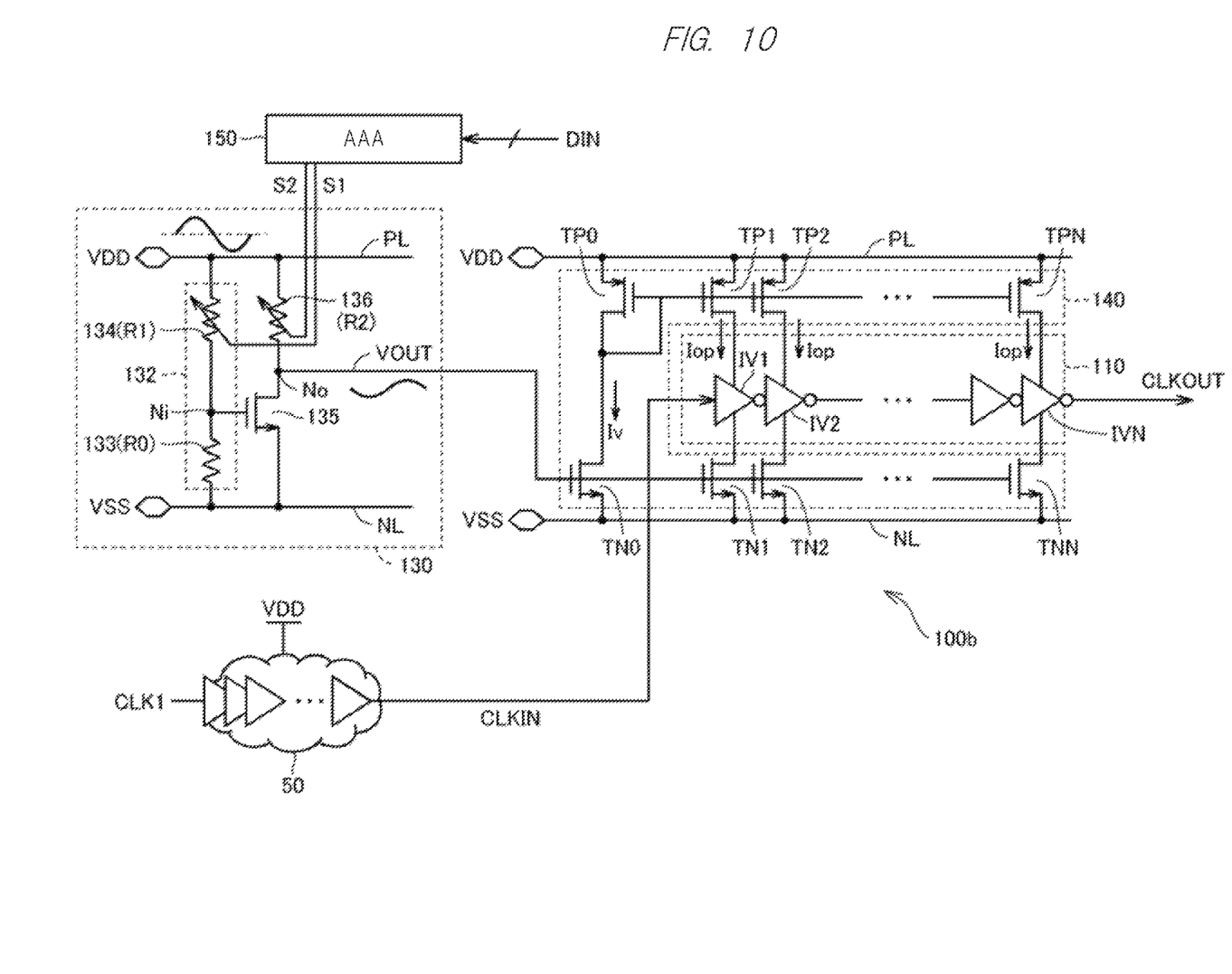
FIG. 10 is a circuit diagram for explaining a configuration example of the jitter cancellation circuit shown in FIG. 9.

FIG. 10 shows a circuit diagram for explaining a configuration example of the jitter cancellation circuit 100b shown in FIG. 9.

Referring to FIG. 10, the modification example of the first embodiment differs from the first embodiment (FIG. 7) in that the resistance elements 134 and 136 of the amplifier 130 are formed of variable resistance elements. The electrical resistance value R1 of the resistance element 134 is variably set by the control signal S1. Similarly, the electrical resistance value R2 of the resistance element 136 is variably set by the control signal S2. The configuration of other parts in FIG. 10 is the same as that in FIG. 7, so that a detailed description thereof will not be repeated.

As a result, in the jitter canceling circuit 100b according to the modification example of the first embodiment, the electric resistance values R1 and R2 that determine the amplification characteristics of the amplifier 130 can be variably adjusted by the input signal DIN from the other of the jitter cancellation circuit 100b to the resister 150. Except for this point, the configuration and the operation of the jitter cancellation circuit 100b according to the modification example of the first embodiment are the same as those of the jitter cancellation circuit 100a according to the first embodiment, so that a detailed description thereof will not be repeated.

This makes it possible to arbitrarily change, by the input signal DIN, the amplification characteristic of the amplifier 130, that is, increase/decrease characteristics of the operating current Iop with respect to the fluctuation component of the power supply voltage VDD. Since the input signal DIN to the register 150 can be given different values from the outside of the jitter cancellation circuit 100b, such characteristics can be easily adjusted for testing. Thus, the input signal DIN corresponds to one example of an "adjustment signal" and the register 150 corresponds to one example of an "adjustment input unit".

Therefore, according to the modification example of the first embodiment, in addition to the effects described in the first embodiment, it becomes easier to adjust the characteristics of the amplifier 130 for operating the jitter cancellation circuit at the optimum point. More specifically, the optimum values of the electrical resistance values R1 and R2 for adjusting an inverting amplification gain and a DC operating point of the amplifier 130 can easily be searched for by analysis under variance of the input signal DIN.

Second Embodiment

In a second embodiment, output feedback control of the jitter cancellation circuit will be further explained.

Figure 11:
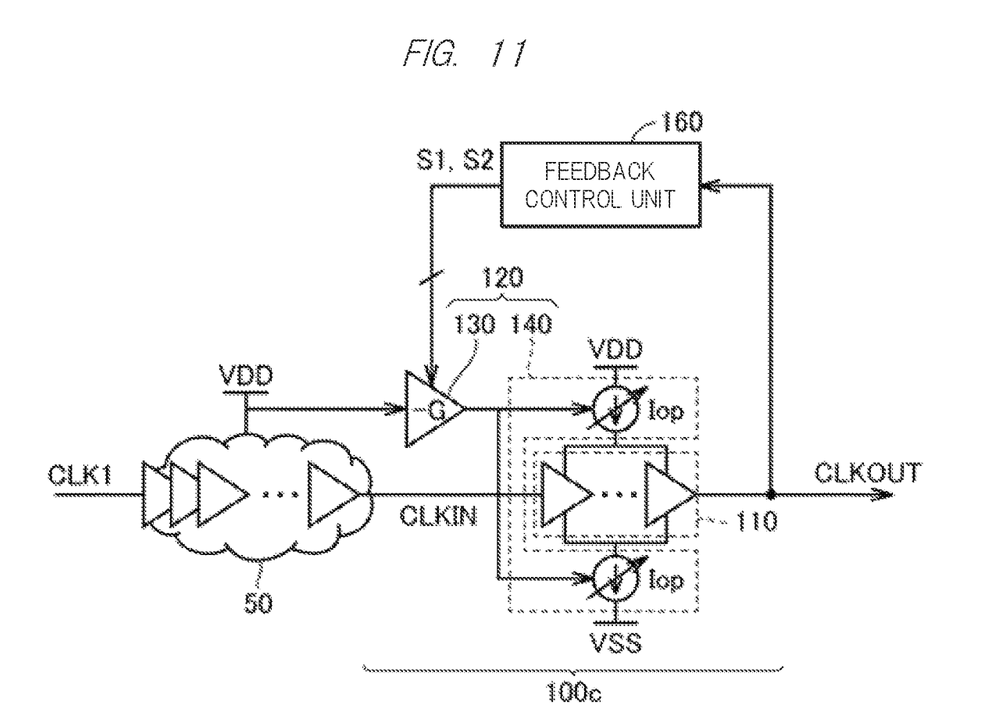
FIG. 11 is a block diagram for explaining a configuration example of a jitter cancellation circuit according to a second embodiment.

FIG. 11 is a block diagram for explaining a configuration of a jitter cancellation circuit according to a second embodiment.

Referring to FIG. 11, a jitter cancellation circuit 100c according to a second embodiment differs from the jitter cancellation circuit 100a (FIG. 4) according to the first embodiment in that it further includes a feedback control unit 160. The feedback control unit 160 generates control signals S1 and S2 similar to those in the modification example of the first embodiment based on an output clock CLKOUT from the jitter cancellation circuit 100c.

Figure 12:
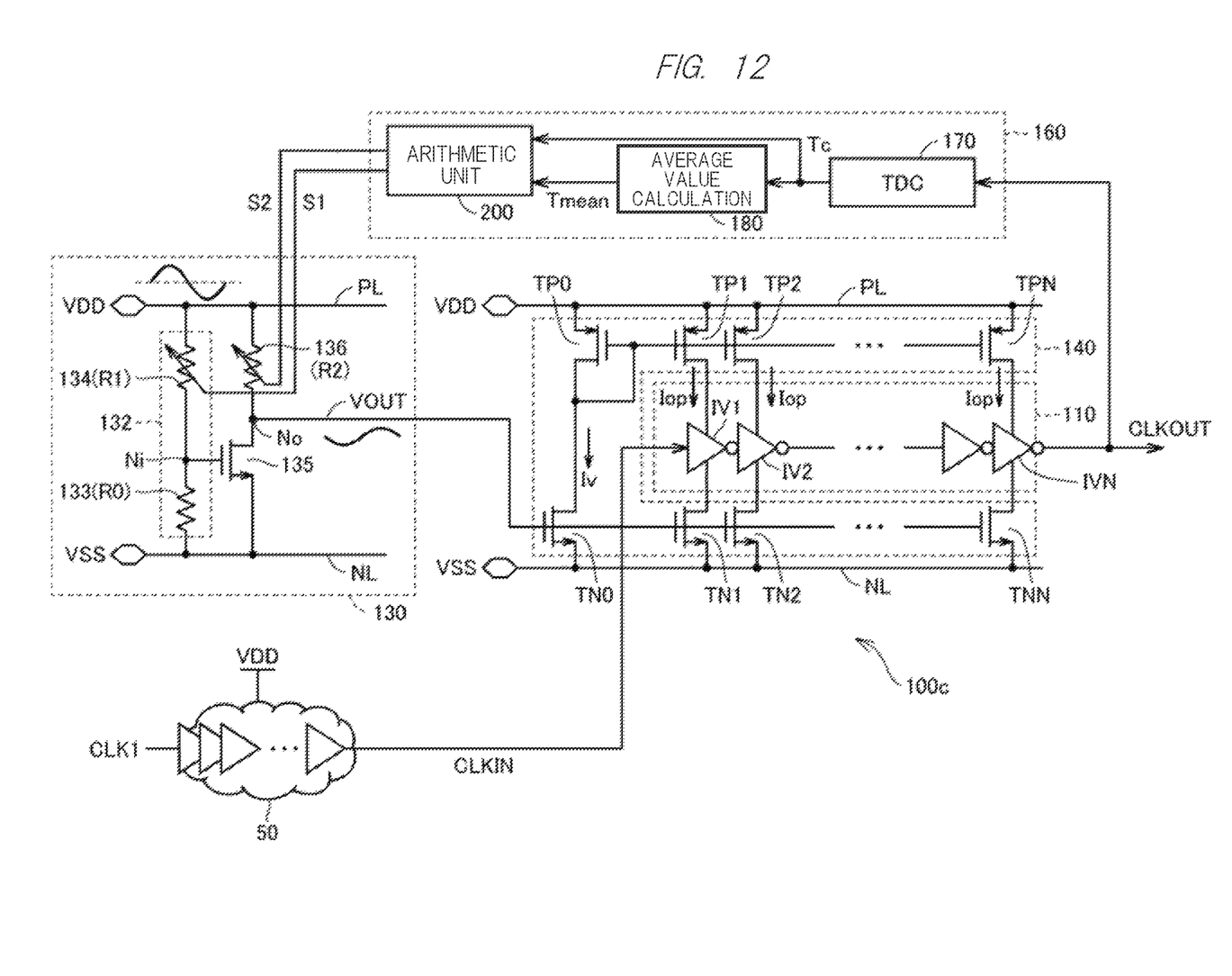
FIG. 12 is a circuit diagram for explaining a configuration example of the jitter cancellation circuit shown in FIG. 11.

FIG. 12 shows a circuit diagram for explaining a configuration example of the jitter cancellation circuit 100c shown in FIG. 11.

Referring to FIG. 12, in the amplifier 130 in the jitter cancellation circuit 100c according to the second embodiment, each of a resistance element 134 (electrical resistance value R1) and a resistance element 136 (electric resistance value R2) is configured by a variable resistance element. In the second embodiment, the control signals S1 and S2 of the electrical resistance values R1 and R2 are generated by the feedback control unit 160.

The feedback control unit 160 has a TDC (Time to Digital Converter) circuit 170 for measuring a cycle of the output clock CLKOUT, an average value calculation unit 180, and a control calculation unit 200. As will be described later, the control calculation unit 200 is a constant controller for analog elements that make up the amplifier 130, here, functions as a controller of the electric resistance value R1 of the resistance element 134 and the electric resistance value of the resistance element 136 by feedback of the output clock CLKOUT.

Figure 13:
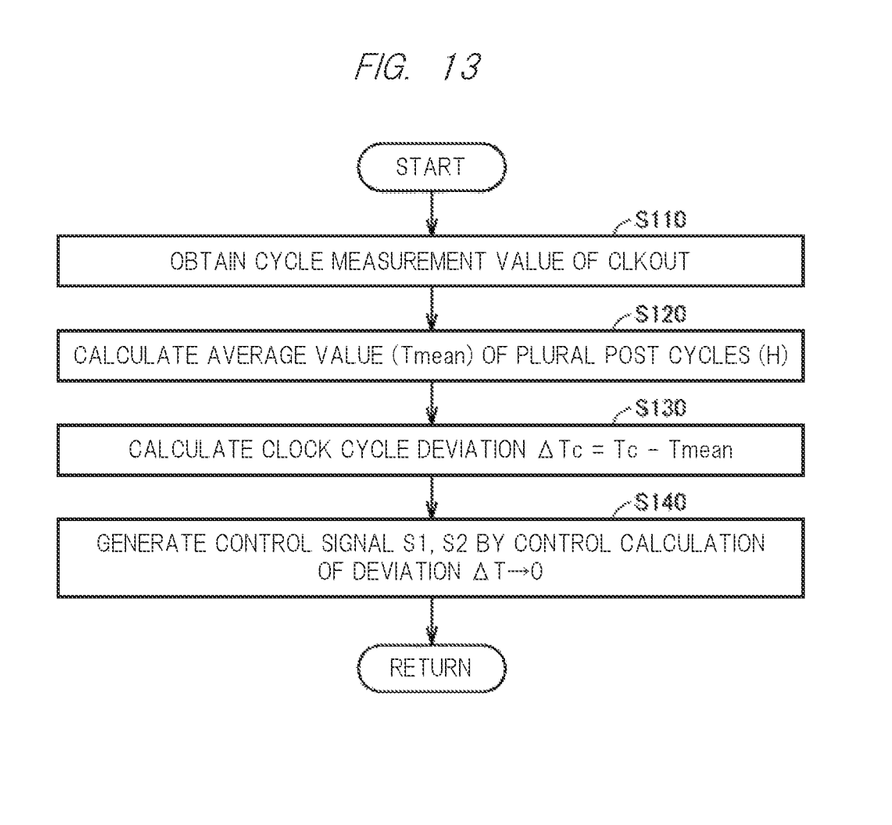
FIG. 13 is a flowchart for explaining an operation example of a feedback control unit.

FIG. 13 shows a flowchart for explaining an operation example of the feedback control unit 160.

Referring to FIG. 13, the feedback control unit 160 obtains a cycle measurement value of the output clock CLKOUT from a step (hereinafter simply referred to as "S") 110. A processing of S110 is implemented by a TDC circuit 170 in FIG. 12.

Figure 14:
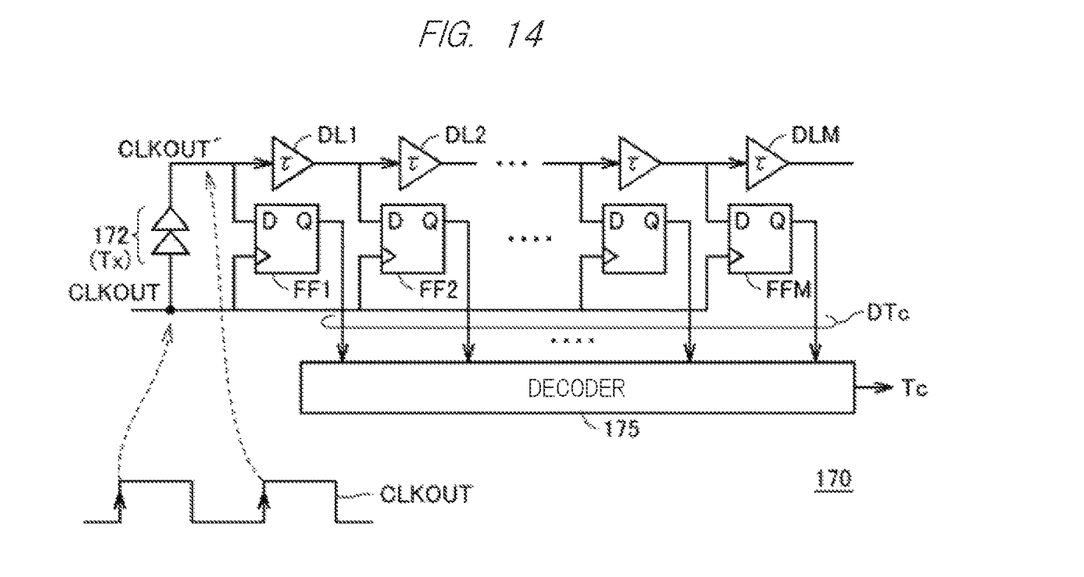
FIG. 14 is a circuit diagram for explaining a configuration example of a TDC circuit shown in FIG. 12.

A configuration example of the TDC circuit 170 is shown in FIG. 14. The TDC circuit 170 has a delay element 172, M delay elements DL1 to DLM (where M is an integer equal to or greater than 2), and M flip-flops FF1 to FEM.

The delay element 172 and the delay elements DL1 to DLM are connected in series. The delay element 172 gives a predetermined delay time Tx corresponding to one cycle (standard value) of the output clock CLKOUT. In contrast, each of the delay elements DL1 to DLM provides a delay time τ.

The output clock CLKOUT is inputted to the delay element 172, and the output clock CLKOUT' delayed by one cycle is inputted to the M first-stage delay elements DL1. The output clock CLKOUT' is successively given the delay time τ by each of the delay elements DL1 to DLM.

Inputs of the delay elements DL1 to DLM are inputted to respective D terminals of the flip-flops FF1 to FFM. Meanwhile, the output clock CLKOUT is inputted to a CLK terminal of each of the flip-flops FF1 to FFM. Outputs (Q terminals) of the flip-flops FF1 to FFM are inputted to a decoder 175.

With such a configuration, from the M flip-flops FF1 to FFM, an M-bit digital value DTc that measures the delay time τ as resolution outputs, to the decoder 175, a time difference between the output clock CLKOUT and the delayed CLKOUT'.

For example, if the delay time Tx is the sum of about one cycle of the output clock CLKOUT and τ·(M/2), a time difference between each rising edge of the output clock CLKOUT and the next rising edge after one cycle can be measured within a range of 0±τ·(M/2). In this manner, the decoder 175 can output the cycle measurement value Tc of the output clock CLKOUT based on the digital value DTc each time a rising edge is inputted.

Referring to FIG. 13 again, a feedback control unit 160 calculates a cycle average value Tmean, which is an average value of the cycle measurement values Tc from the TDC circuit 170, in S120. For example, in S120, a moving average value of predetermined H (H: an integer equal to or greater than 2) cycle measurement values Tc is calculated. An average value calculation unit 180 in FIG. 12 can be configured so as to execute the above-described moving average value calculation by using the cycle measurement value Tc obtained for each cycle of the output clock CLKOUT as an input.

Next, in S130, the feedback control unit 160 calculates a clock cycle deviation ΔTc (ΔTc=Tc−Tmean) corresponding to a difference between the cycle average value Tmean calculated in S120 and the cycle measurement value Tc obtained in S110. Further, the feedback control unit 160 generates the control signals S1 and S2 for amplifier 130 by control calculation for bringing the clock cycle deviation ΔTc closer to zero in S140. Consequently, realized is the feedback control that adjusts the amplification characteristics of the amplifier 130, that is, the increase/decrease characteristics of the operating current Iop with respect to the fluctuation component of the power supply voltage VDD based on the cycle measurement value of the output clock CLKOUT.

Figure 15:
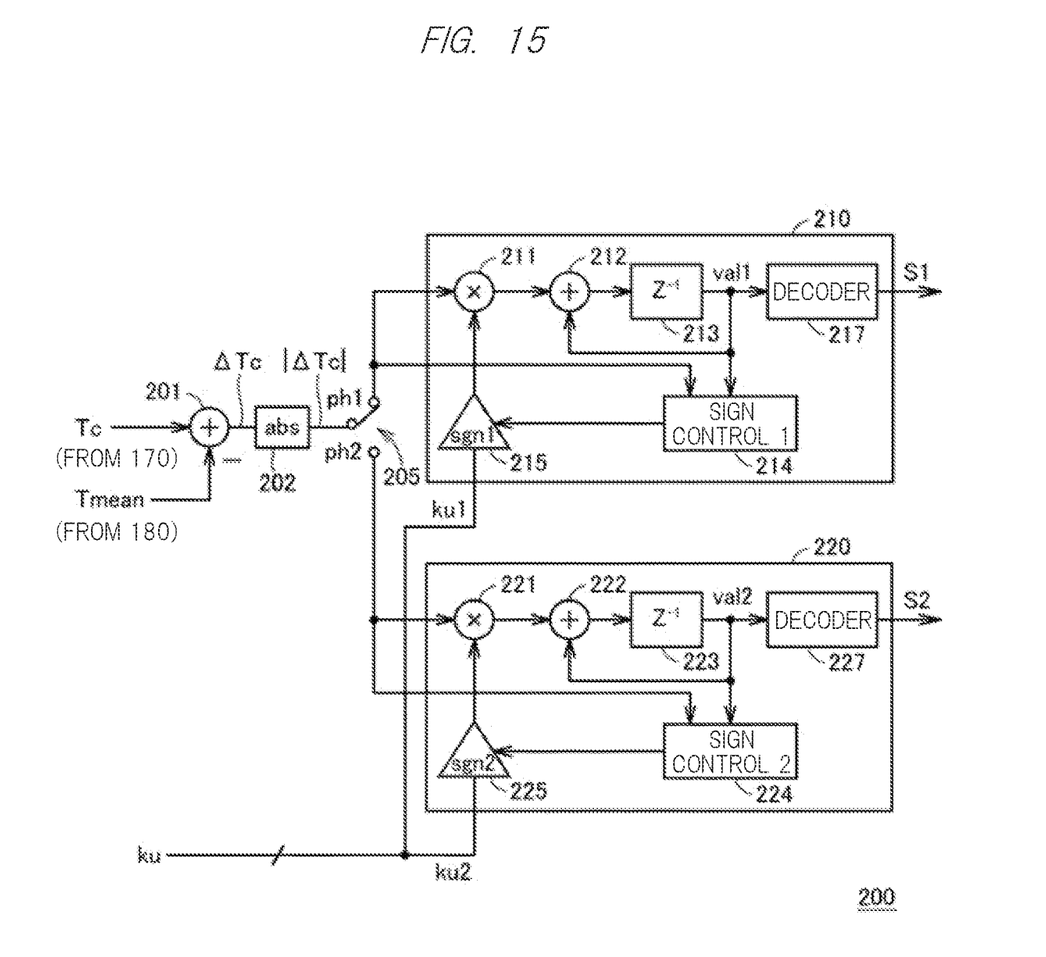
FIG. 15 is a block diagram for explaining a configuration example of a control calculation unit shown in FIG. 12.

FIG. 15 shows a configuration example of a control calculation unit 200 of FIG. 12 for realizing processings of S130 and S140 of FIG. 14.

As shown in FIG. 15, the control calculation unit 200 includes a deviation calculation unit 201, an absolute value calculation unit 202, a unit switching switch 205, a calculation unit 210 that generates a control signal S1, and an arithmetic unit 220 that generates a control signal S2.

The deviation calculation unit 201 outputs the clock cycle deviation ΔTc for each cycle of the output clock CLKOUT by subtracting the cycle average value Tmean of the average value calculation unit 180 from the cycle measurement value Tc of the TDC circuit 170. The clock cycle deviation ΔTc is inputted to each of integral control units 191 and 192. An absolute value calculation unit 202 outputs an absolute value |ΔTc| of the clock cycle deviation ΔTc calculated by the deviation calculation unit 201. The unit switching switch 205 connects an output side of the absolute value calculation unit 202 to an input side (ph1) of the arithmetic unit 210 or an input side (ph2) of the arithmetic unit 220. For example, connection with the ph1 side and connection with the ph2 side are switched every predetermined multiple cycles of the output clock CLKOUT. Consequently, the absolute values |ΔTc| of the clock cycle deviation for the multiple cycles are alternately inputted to the arithmetic units 210 and 220.

The arithmetic unit 210 has a multiplicator 211, an adder 212, a z-transform delay element 213, a sign controller 214, and a sign setter 215. The multiplicator 211 multiplies the absolute value |ΔTc| of the clock cycle deviation transmitted by the unit switching switch 205 by an adjustment coefficient ku1 given a sign sgni that is set to "+ (positive)" or "− (negative)" by the sign setter 215. That is, the multiplicator 211 outputs ku1•|ΔTc| or −ku1 •·|ΔTc| according to the sign sgn1.

An output value (±ku1•·|ΔTc|) of the multiplicator 211 is integrated by the delay element 213 and the adder 212 to calculate an integrated value val1. That is, +ku1 and −ku1 correspond to integral gains of integral control by the delay element 213 and the adder 212. The sign controller 214 sets the sign sgn1 based on a behavior (change direction) of the absolute value |ΔTc| of the clock cycle deviation and the integral value val1. A decoder 217 converts an integrated value val1 into the control signal S1 according to predetermined decoding conditions.

Similarly, the arithmetic unit 220 has a multiplicator 221, an adder 222, a z-transform delay element 223, a sign controller 224, and a sign setter 225. The multiplicator 221 multiplies the absolute value |ΔTc| of the clock cycle deviation transmitted by the unit switching switch 205 by the adjustment coefficient ku2 given a sign sgn2 set to "+ (positive)" or "− (negative)" by the sign setter 225. That is, the multiplicator 221 outputs ku2·•|ΔTc| or −ku2·•|ΔTc| according to the sign sgn2.

The output value (±ku2·•|ΔTcI) of the multiplicator 221 is integrated by the delay element 223 and the adder 222 to calculate an integrated value val2. That is, +ku2 and −ku2 correspond to integral gains of integral control by the delay element 223 and the adder 222. The sign controller 224 sets the sign sgn2 based on a behavior (change direction) of the absolute value |ΔTc| of the clock cycle deviation and the integral value val2. The decoder 227 converts the integral value val2 into the control signal S2 according to predetermined decoding conditions. For example, the decoding conditions of the decoders 217 and 227 can be set so that the electrical resistance values R1 and R2 increase as the integral values val1 and val2 rise and, conversely, the electrical resistance values R1 and R2 decreases as the integral values val1 and val2 falls. As a result, the electrical resistance values R1 and R2 in the amplifier 130 change corresponding to the integrated values val1 and val2.

Next, an operation example of the control calculation unit 200 shown in FIG. 15 will be described by using FIG. 16.

In FIG. 15, a time length of each of periods TT1 to TT11 corresponds to L (L: an integer equal to or greater than 2) cycles of the output clock CLKOUT. An output destination of the unit switching switch 205 is switched for each period. For example, in the periods TT1, TT3, TT5, TT7, TT9, and TT11 (odd-numbered), the unit switching switch 205 is controlled to a ph1 side (FIG. 15), and inputs the absolute value |ΔTc| of the clock cycle deviation to the arithmetic unit 210 at each period of the output clock CLKOUT. Meanwhile, during these periods, the absolute value |ΔTc| of the clock cycle deviation outputted from the absolute value calculation unit 202 is not transmitted to the arithmetic unit 210.

Conversely, in periods TT2, TT4, TT6, TT8, TT10 (even-numbered), the unit switching switch 205 is controlled to a ph2 side (FIG. 15), and inputs the absolute value |ΔTc| of the clock cycle deviation to the arithmetic unit 220 at each period of the output clock CLKOUT. Meanwhile, during these periods, the absolute value |ΔTc| of the clock cycle deviation outputted from the absolute value calculation unit 202 is not transmitted to the arithmetic unit 210.

In the arithmetic unit 210, the sign controller 214 sets a sign sgn1 for the next period according to the change direction of the absolute value |ΔTc| of the clock cycle deviation inputted from the unit switching switch 205. Specifically, when the absolute value of the clock cycle deviation |ΔTc| is decreasing, the arithmetic unit 210 acknowledges that a current change direction of the integral value val1, that is, current setting of the sign sgn1 is correct, and maintains the setting of the sign sgn1. Conversely, when the absolute value |ΔTc| of the clock cycle deviation is increasing, the arithmetic unit 210 acknowledges that the current change direction of the integral value val1, that is, the current setting of the sign sgn1 is incorrect, and inverts the setting of the sign sgn1.

Figure 16:
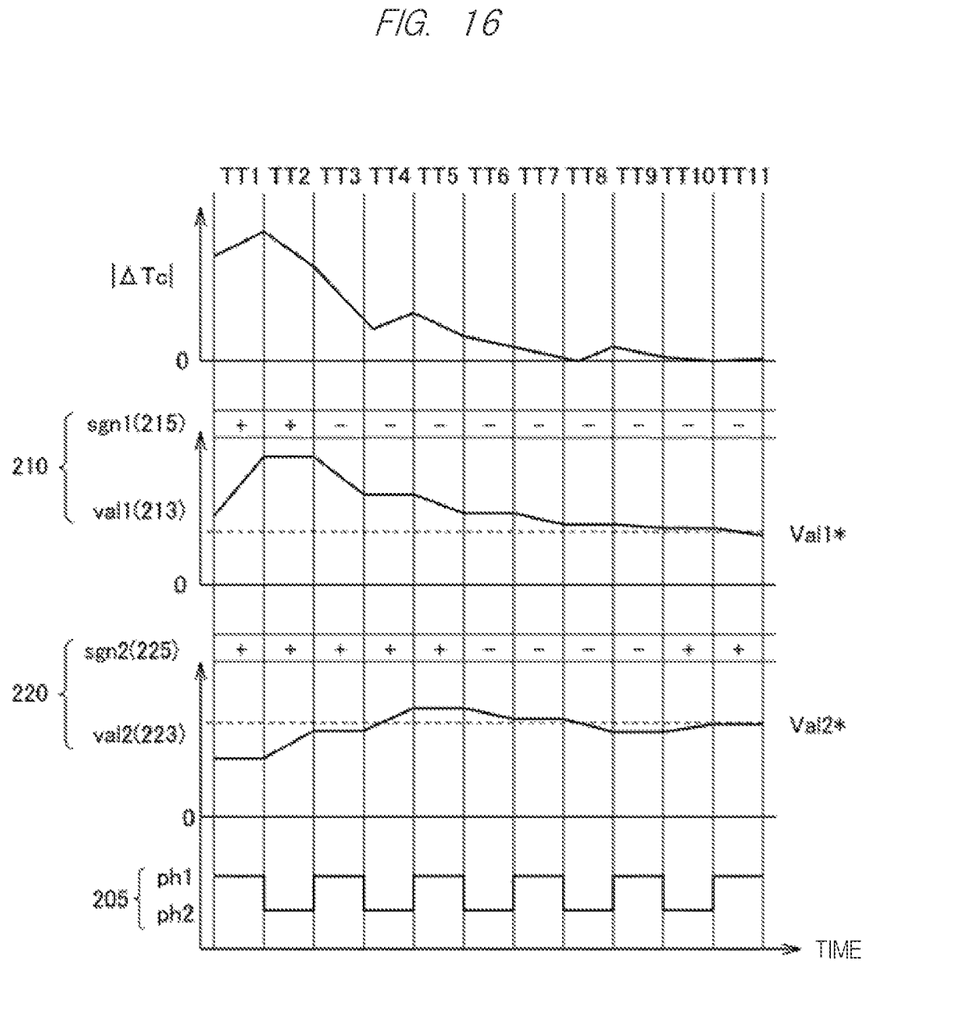
FIG. 16 is a waveform diagram for explaining an operation example of the control calculation unit shown in FIG. 15.

For example, in the example of FIG. 16, in the period TT1, the integral value val1 increases, and the absolute value |ΔTc| of the clock cycle deviation increases under the condition that the sign sgn1 is set to "+". Therefore, during the period TT3, in which the absolute value |ΔTc| of the clock cycle deviation is inputted to the arithmetic unit 210, next to the period TT1, the sign sgn1 is inverted from the period TT1 and is set to "−" in order to invert the change direction of the integral value val1. Consequently, the integral value val1 increased during the period TT1 starts to decrease during the period TT3. Incidentally, in each of the periods (periods TT2, TT4, TT6, TT8, and TT10 in FIG. 16) in which |ΔTc| is not inputted to the arithmetic unit 210, the integral value val1 is unchanged, and the setting of the sign sgn1 is maintained similarly to the immediately previous period.

In the subsequent periods TT3, TT5, TT7, TT9, and TT11, the absolute value |ΔTc| of the clock cycle deviation decreases. Consequently, the setting of the sign sgn1 is maintained at "−" and, under this, |ΔTc| decreases toward zero.

Similarly, in the arithmetic unit 220, the sign controller 224 sets a sign sgn2 for the next period according to the change direction of the absolute value |ΔTc| of the clock cycle deviation inputted from the unit switching switch 205. That is, when the absolute value |ΔT| of the clock cycle deviation is decreasing within a certain period, the setting of the sign sgn2 is maintained in order to maintain a current change direction of an integral value val2, while when ΔTc| is increasing, the setting of sign sgn2 in the next period is reversed in order to reverse the current change direction of the integral value val2.

For example, in the example of FIG. 16, in the period TT2, the integral value val2 changes in an increase direction and the absolute value |ΔTc| of the clock cycle deviation is decreasing under the condition that the sign sgn2 is set to "+". Consequently, the sign sgn2 in the period TT4 when |ΔTc| is next inputted to the arithmetic unit 220 is maintained at "+", which is the same as in the period TT2, in order to maintain the change direction of the integral value val2. However, the absolute value |ΔTc| of the clock cycle deviation increases under the condition that the sign sgn2 is set to "+" in the period TT4. Therefore, the sign sgn2 in the period TT6 in which |ΔTc| is next inputted to the arithmetic unit 220 is set to "−" opposite to the sign in the period TT4 in order to reverse the change direction of the integral value val2.

During the period TT6, the absolute value |ΔTc| of the clock cycle deviation decreases under the condition that the sign sgn2 is "−", so that the sign sgn2 is maintained at "−" during the period TT8. However, during the period TT8, the absolute value |ΔTc| of the clock cycle deviation increases under the condition that the sign sgn2 is set to "−" Consequently, during the period TT10, the sign sgn2 is inverted to "+" in order to reverse the change direction of the integral value val2.

Incidentally, in each period during which |ΔTc| is not inputted to the arithmetic unit 220 (periods TT1, TT3, TT5, TT7, TT9, and TT11 in FIG. 16), the integral value val1 is unchanged, and the setting of the sign sgn2 is maintained like the same as that during the immediately previous period.

In this way, in the arithmetic units 210 and 220, the sign (positive/negative) of the gain is switched and is integrally controlled by monitoring whether the absolute value |ΔTc| of the clock cycle deviation is decreasing and by switching the signs sgn1 and sgn2. As a result, each of the integral value val1 of the arithmetic unit 210 and the integral value val2 of the arithmetic unit 220 can converge to stationary values Val1* and Val2* for zeroing the absolute value |ΔTc| of the clock cycle deviation. It is understood that the stationary values Val1* and Val2* correspond to the characteristics of the amplifier 130 for zeroing the clock cycle deviation ΔTc (|ΔTc|), specifically, correspond to the electrical resistance values R1 and R2.

In this way, the feedback control unit 160 can appropriately set the amplification characteristics of the amplifier 130, specifically, an inversion amplification gain dependent on the electrical resistance value R2 and the electrical resistance value R1 for constantly maintaining a DC operating point so that the clock deviation ΔTc approaches zero.

For example, the feedback control unit 160 can be configured by a digital computing element. Furthermore, functions of the average value calculation unit 180 and the control calculation unit 200 can also be realized by software. Also, the configuration of the control calculation unit 200 shown in FIG. 15 is an example, and the control calculation unit 200 can be configured according to any control calculation for making the clock cycle deviation ΔTc close to zero.

As described above, according to the second embodiment, in addition to the effects described in the first embodiment, the characteristics of the amplifier 130 can be automatically adjusted by the feedback control of the output clock CLKOUT in order to operate the jitter cancellation circuit at the optimum point. This makes it possible to further enhance the clock jitter suppression effect.

Incidentally, it is also possible to combine the modification example of the first embodiment and the second embodiment. In this case, in a system equipped with a jitter cancellation circuit, after determining reference values (default values) of the electrical resistance values R1 and R2 by using the register 150 during offline to adjust the characteristics of the amplifier 130, the combination can be configured to automatically variably adjust the electric resistance values R1 and R2 by feedback control unit 160 during online.

In FIGS. 14 and 15 described in the second embodiment, the TDC 170 corresponds to an example of a "first calculation unit". Similarly, the deviation calculation unit 201 and the absolute value calculation unit 202 (FIG. 15) correspond to an example of a "second calculation unit". Furthermore, the arithmetic unit 210 (FIG. 15) corresponds to an example of a "third arithmetic unit", the integral value val1 corresponds to a "first integral value", and the multiplication value of the adjustment coefficient kc1 and the sign sgn1 is a "first integral control gain". Similarly, the arithmetic unit 220 (FIG. 15) corresponds to an example of a "fourth arithmetic unit", the integral value val2 corresponds to a "second integral value", and the multiplication value of the adjustment coefficient kc2 and the sign sgn2 corresponds to a "second integral control gain" Also, each of the periods TT1, TT3, TT5, TT7, TT9 and TT11 in FIG. 16 corresponds to an example of a "first period", and each of the periods TT2, TT4, TT6, TT8 and TT10 corresponds to an example of a "second period".

Third Embodiment

A third embodiment will describe an arrangement example of the jitter cancellation circuit explained in the first and second embodiments.

Figure 17:
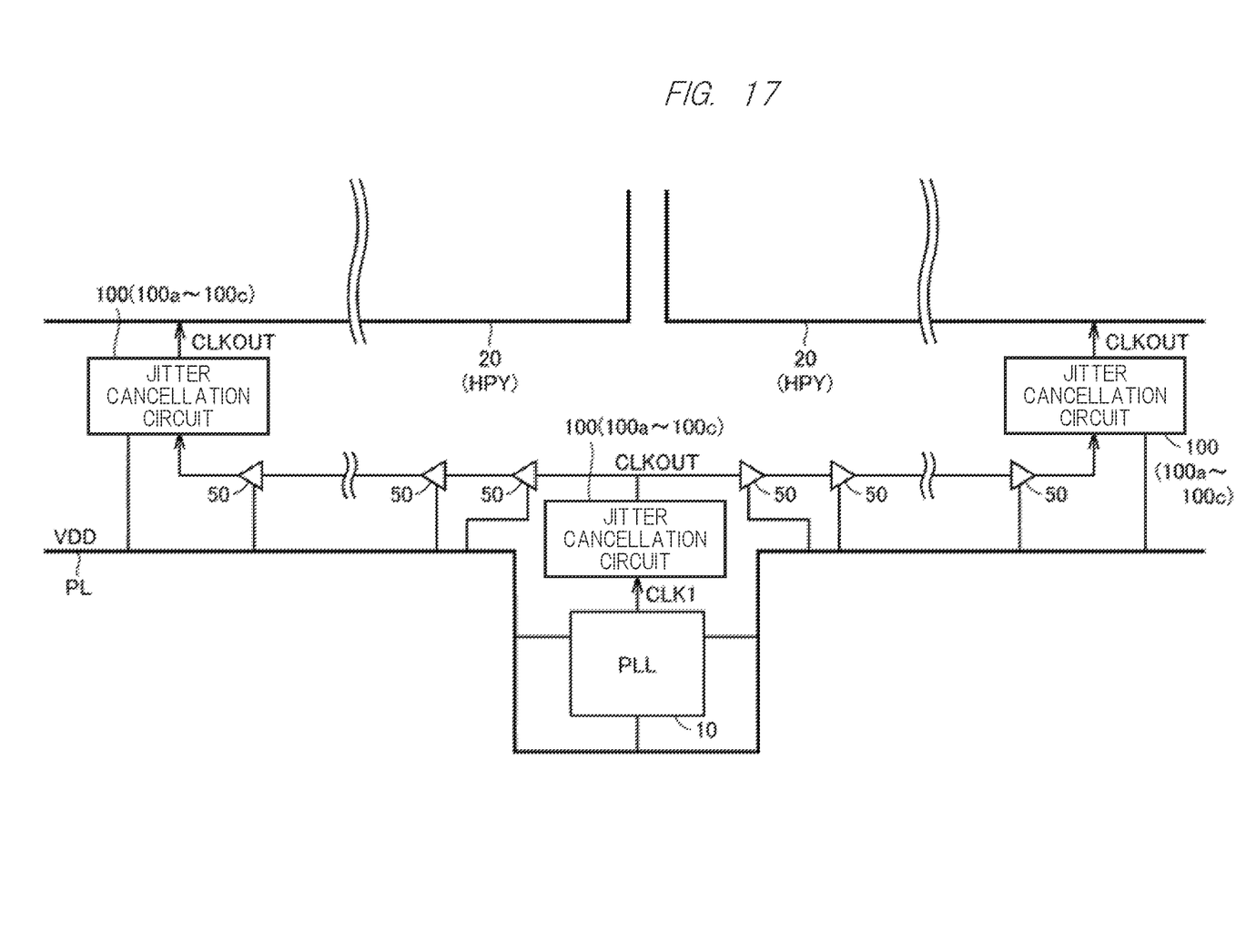
FIG. 17 is a block diagram for explaining an arrangement example of a jitter cancellation circuit according to a third embodiment.

FIG. 17 is a block diagram for explaining an arrangement example of a jitter cancellation circuit according to a third embodiment.

Referring to FIG. 17, a clock CLK1 outputted from a clock generation circuit (PLL) 10 is supplied to a clock supply destination circuit 20, for example, to a module configurating a physical layer (PHY) by a clock propagation path in which a clock propagation element 50 is arranged. The clock generation circuit 10 and a plurality of clock propagation elements 50 operate by receiving supply of a common power supply voltage VDD from a power supply wiring PL.

A jitter cancellation circuit 100 in FIG. 17 includes the jitter cancellation circuits 100a to 100c described in the first embodiment, its modification example, and the second embodiment.

For example, the jitter cancellation circuit 100 can be arranged so that the clock generation circuit 10 and the common power supply voltage VDD is supplied and the clock CLK1 from the clock generation circuit 10 is inputted as CLKIN. By doing so, even if a configuration for suppressing jitter caused by power supply noise is omitted or simplified in the clock generation circuit 10, it can be expected that the jitter superimposed on the clock CLK1 is compensated for and the clock is cleaned.

Alternatively, the jitter cancellation circuit 100 can be arranged so that the output clock CLKOUT of the jitter cancellation circuit 100 is supplied to the clock supply destination circuit 20. The clock propagation element 50 and the common power supply voltage VDD are supplied to the jitter cancellation circuit 100. By doing so, the supply destination circuit 20 can operate by using a clean clock in which the jitter is suppressed.

In this way, as long as the jitter cancellation circuit 100 according to the present embodiment receives the supply of the clock generation circuit 10 or the clock propagation element 50 and the common power supply voltage VDD in a clock propagation path from the clock generation circuit 10 to any destination circuit 20, it can be arranged at any location and with any number on the clock propagation path.

Regarding the plurality of embodiments described above, it has been planned from the beginning of the application that the configurations described in the respective embodiments are appropriately combined within a range of not causing inconsistency or contradiction including combinations not mentioned in the specification. This point is also described in a confirmatory manner.

Although the present disclosure has been specifically described above based on the embodiments, it goes without saying that the present disclosure is not limited to the embodiments and can be variously modified without departing from the gist thereof.

What is claimed is:
1. A jitter cancellation circuit comprising:
a clock buffer inputting a clock outputted from a clock generation circuit or a clock propagation element that is driven by a power supply voltage; and a current control unit increasing and decreasing an operating current of the clock buffer with an opposite phase of a fluctuation component of the power supply voltage,
wherein the clock buffer outputs the clock by applying a delay time that decreases as the operating current increases and increase as the operating current decreases with respect to the inputted clock.

2. The jitter cancellation circuit according to claim 1, further comprising an adjustment input unit for inputting, from an outside of the jitter cancellation circuit, an adjustment signal of an increase/decrease characteristic of the operating current with respect to the fluctuation component in the current control unit.

3. The jitter cancellation circuit according to claim 1, further comprising a feedback control unit adjusting an increase/decrease characteristic of the operating current with respect to the fluctuation component in the current control unit based on cycle measurement values of an output clock from the clock buffer.

4. The jitter cancellation circuit according to claim 3, wherein the feedback control unit adjusts the characteristic of the current control unit so that a deviation between each of the cycle measurement values and an average value of a plurality of post cycle measurement values approaches zero.

5. The jitter cancellation circuit according to claim 1, wherein the current control unit includes:
an amplifier outputting a voltage signal in which the fluctuation component of the inputted power supply voltage is inversed and amplified; and
a variable current source circuit supplying, as the operating current, an output current increased/decreased according to the voltage signal to the clock buffer, and
wherein the variable current source circuit is configured so that the output current is larger as a voltage of the voltage signal is higher.

6. The jitter cancellation circuit according to claim 5, further comprising an adjustment input unit for inputting an adjustment signal of the increase/decrease characteristic of the voltage signal with respect to the fluctuation component in the amplifier from an outside of the jitter cancellation circuit.

7. The jitter cancellation circuit according to claim 5, further comprising a feedback control unit adjusting the increase/decrease characteristic of the voltage signal with respect to the fluctuation component in the amplifier based on cycle measurement values of an output clock from the clock buffer.

8. The jitter cancellation circuit according to claim 7, wherein the feedback control unit adjusting the increase/decrease characteristic in the amplifier so that a deviation between each of the cycle measurement values and an average value of a plurality of post cycle measurement values approaches zero.

9. The jitter cancellation circuit according to claim 5, wherein the amplifier has:
a voltage dividing circuit configured to include a first resistance element and dividing the power supply voltage;
a transistor, a negative electrode of the transistor being grounded and a control electrode of the transistor receiving an output voltage of the voltage dividing circuit; and
a second resistance element connected between a supply node of the power supply voltage and a positive electrode of the transistor.

10. The jitter cancellation circuit according to claim 9, wherein the first and second resistance elements are configured by variable resistance elements, and
wherein the jitter cancellation circuit further has an adjustment input unit for inputting, from an outside of the jitter cancellation circuit, an adjustment signal for adjusting a first electric resistance value of the first resistance element and a second electric resistance value of the second resistance element.

11. The jitter cancellation circuit according to claim 9, wherein the first and second resistance elements are configured by variable resistance elements, and
wherein the jitter cancellation circuit further has a feedback control unit adjusting a first electric resistance value of the first resistance element and a second electric resistance value of the second resistance element in the amplifier based on a cycle measurement value of an output clock from the clock buffer.

12. The jitter cancellation circuit according to claim 11, wherein the feedback control unit further has:
a first arithmetic unit calculating an average value of a plurality of post measurement values;
a second arithmetic unit calculating an absolute value of a deviation of each of the cycle measurement values with respect to the average value;
a third arithmetic unit generating a first control signal for adjusting the first electric resistance value so that the deviation approaches zero based on a first integral value of an absolute value of the deviation by first integral control; and
a fourth arithmetic unit generating a second control signal for adjusting the first electric resistance value so that the deviation approaches zero based on a second integral value of an absolute value by second integral control.

13. The jitter cancellation circuit according to claim 12, wherein the feedback control unit operates so as to alternatively provide a first period, in which the first integral value is updated according to an absolute value of the deviation from the second arithmetic unit, while the second integral value is maintained, and a second period, in which the second integral value is updated according to an absolute value of the deviation from the second arithmetic unit, while the first integral value is maintained,
wherein the third arithmetic unit is configured to switch positive/negative of a gain of the first integral control when an absolute value of the deviation increases in the first period, and
wherein the fourth arithmetic unit is configured to switch positive/negative of a gain of the second integral control when an absolute value of the deviation increases in the second period.

14. The jitter cancellation circuit according to claim 1, wherein the clock propagation element is connected in a path between the clock generation circuit and a supply destination of the clock, and
wherein the jitter cancellation circuit operates by receiving the clock propagation element or clock generation circuit and a common power supply voltage.

* * * * *